United States Patent [19]
Wardwell

[11] Patent Number: 5,923,177
[45] Date of Patent: Jul. 13, 1999

[54] PORTABLE WEDGE PROBE FOR PERUSING SIGNALS ON THE PINS OF AN IC

[75] Inventor: Robert H. Wardwell, Colorado Springs, Colo.

[73] Assignee: Hewlett-Packard Company, Palo Alto, Calif.

[21] Appl. No.: 08/825,081

[22] Filed: Mar. 27, 1997

[51] Int. Cl.$^6$ .................................................. G01R 1/073
[52] U.S. Cl. ............................................................ 324/754
[58] Field of Search ..................................... 324/754, 757, 324/72.5

[56] References Cited

U.S. PATENT DOCUMENTS

| | | | |
|---|---|---|---|
| 4,835,465 | 5/1989 | Gergin | 324/72.5 X |
| 5,463,324 | 10/1995 | Wardwell et al. | 324/754 |
| 5,506,515 | 4/1996 | Godshalk et al. | 324/762 |
| 5,507,652 | 4/1996 | Wardwell | 439/68 |
| 5,701,086 | 12/1997 | Wardwell | 324/762 |

Primary Examiner—Glenn W. Brown
Attorney, Agent, or Firm—Edward L. Miller

[57] ABSTRACT

A portable wedge probe for perusing the signals of an IC is produced by mounting a short row of wedges in a housing that serves the dual purposes of: (1) Allowing the gripping and manipulation of the wedges for inspection, the connecting and unconnecting of interconnecting cables, deployment onto, and removal from, the IC; and (2) serving as the housing for and physical location of electrical interconnection(s) between the portable wedge probe and the cable(s) of the measurement (test) equipment. By the term "short row of wedges" we mean, say, two adjacent wedges for the signal on a single intervening interior pin of the IC, up to perhaps nine adjacent wedges for the eight signals on the eight intervening interior pins of the IC, as opposed to having the row of wedges being long enough to engage the entire side of the IC. The portable wedge probe is free standing once applied, and does not rely upon support from another row of wedges deployed on a different side of the IC.

5 Claims, 2 Drawing Sheets

PORTABLE WEDGE PROBE FOR PERUSING SIGNALS ON THE PINS OF AN IC

REFERENCE TO RELATED PATENTS

The subject matter of the present Patent is related to that of previously issued U.S. Patents filed by Robert H. Wardwell and assigned to Hewlett-Packard Co. These are "Probe With Contacts That Interdigitate With and Wedge Between Adjacent Legs of an IC or the Like", filed as Ser. No. 08/143,000 on Oct. 26, 1993 and issued as U.S. Pat. No. 5,463,324 on Oct. 31, 1995, and "Wedge Connector For Integrated Circuits", filed as Ser. No. 08/390,194 on Feb. 17, 1995 and issued as U.S. Pat. No. 5,507,652 on Apr. 16, 1996. U.S. Pat. Nos. 5,463,324 and 5,507,652 are each hereby expressly incorporated herein by reference.

BACKGROUND OF THE INVENTION

There are many settings wherein it is desirable to attach test equipment (e.g., a voltmeter or an oscilloscope) to one or more pins of an integrated circuit. These settings include the laboratory, the production floor, and the maintenance shop. A variety of "DIP clips" have been produced to facilitate this for the venerable dual in-line package. More recent packaging styles having a high number of closely spaced pins on all four sides of the IC's package have made it nearly imperative that all but the most casual (or the most desperate?) probing be performed with the aid of some special tool. This is because it is difficult to locate or identify a particular pin or pins out the many, and because it is physically difficult to maintain proper contact with the probe tip. The legs or pins of the larger IC's are quite small and close together; a slip of the hand can result in a short circuit either between adjacent pins or between a pin of the IC and a nearby component. What's more, this type of unassisted probing, while seemingly quick and flexible, uses up a hand that might better be used doing something else. There is also the issue of how to establish longer term probe contact where the probe is left in place for anywhere from a few minutes to an hour or so.

Accordingly, there has been considerable interest of late in strategies for connecting test equipment to the newer styles of integrated circuit packages. It is in this context that the above incorporated patents to Wardwell arose. The wedge connection strategy that is disclosed therein is truly an improvement over the conventional technique of gripping (squeezing) the IC between opposing contacts disposed on opposite sides of the IC, such as is done with the old fashioned DIP clip. Wardwell's wedges take an entirely different approach, as summarized by the next four paragraphs (as revised after being robbed from the incorporated Wardwell patents).

The (Wardwell) wedge connector comprises tapered fingers of conductive metal separated by an insulator. The tapered fingers are wedge-shaped, in that they are thinnest at their tips, so that they may more easily enter the space between adjacent legs of an IC. A row of tapered wedges (i.e., tapered fingers) is assembled, and spaced apart to interdigitate with the legs of the IC. That is, the legs of the IC also form a row with an amount of inter-leg spacing between the legs along the direction of the row. The IC legs have sides that face each other along the direction of the row, and that are separated by the amount of the inter-leg spacing. By interdigitation we mean that the tapered fingers or wedges penetrate into the inter-leg space and contact the facing sides of the IC legs. Thus, the left-hand side of a wedge entering a particular inter-leg space will come into electrical contact with the right-hand side of the IC leg on the left of that inter-leg space, and the right-hand side of that wedge will come into electrical contact with left-hand side of the IC leg on the right of that inter-leg space. As the depth of penetration is increased the thicker parts of the wedge enter the inter-leg space, filling it completely and causing good wiping action and firm contact pressure between the sides of the IC legs and the sides of the wedges.

Within the row of wedges, the left-hand side of each wedge is electrically connected to the right-hand side of its neighboring wedge on the right, which, by implication means that the right-hand side of each wedge is also electrically connected to the left-hand side of its neighboring wedge to the right. This interconnectedness of the wedges in a row thereof produces a very desirable effect: if there are n-many legs on the IC and n+1 wedges in a row, then each leg of the IC is in electrical contact at two different places with two different wedges. This adds a robust reliability to the wedge connector.

It is to be noted that the wedges interdigitate with the facing sides of adjacent legs of the IC, and that no attempt is made to produce contact with the outer faces of the legs of the IC; instead, the wedges pass between the legs.

Wedge compliance can be improved by fabricating the wedges with air gaps between those portions of their internal layers of material that correspond to the tapered portions of the wedge. This makes the wedges more compressible over their tapered region, as well as somewhat more bendable in the side-to-side direction. Correct initial interdigitation is enhanced by beveling the ends of the conductive surfaces at the tips of the wedges. This reduces the cross section of the wedges, making them "sharper" so that they more easily engage the empty inter-leg spaces. Solder debris accumulation is reduced by having a center piece of insulating material at the central core of the wedge extend beyond the tapered end of the wedge by a small amount, say ten thousandths of an inch. The beveling of the conductive sides of the tapered wedges also assists with solder debris abatement, as sharper edges present less of a shelf with which to gouge the solder and carry a build-up of scraped off solder debris.

However, the various wedge contact apparatus disclosed in the incorporated patents to Wardwell, and summarized above, are all oriented around making simultaneous contact with, if not each and every pin on the IC, at least a large number of pins, and, if not from all four sides of a quad flat pack, at least from two different sides. There are many instances where the task at hand requires probing only one or a relatively few number of pins at a time. The strategy of wedging between the pins or legs of an IC to obtain electrical contact is an attractive one for many reasons, most of which are set out in Wardwell's patents. It would be desirable if the wedge probe technique could be adapted to making simultaneous contact (for probing) with one, two, or some other small number of adjacent pins or legs of an IC, and for readily changing the location on the IC of where such simultaneous contact occurred, almost as readily as one deploys a scope probe on a low density printed circuit board loaded with discrete parts. That is, it would be desirable if a wedge probe for electrically connecting to just one or to a limited and relatively small number of pins on an IC were "portable", in the sense that it is readily re-deployable at different locations on the IC. Such a wedge probe would have far fewer wedges than needed to simultaneously connect to every pin on the IC, and would allow an easy perusal of the IC's signals by simply repositioning the probe. Such a portable wedge probe would also be less expensive than its full sized counterpart.

SUMMARY OF THE INVENTION

A portable wedge probe for perusing the signals of an IC may be produced by mounting a short row of wedges in a housing that serves the dual purposes of: (1) Allowing the griping and manipulation of the wedges for inspection, the connecting and unconnecting of interconnecting cables, deployment onto, and removal from, the IC; and (2) serving as the housing for and physical location of electrical interconnection(s) between the portable wedge probe and the cable(s) of the measurement (test) equipment. By the term "short row of wedges" we mean, say, two adjacent wedges for the signal on a single intervening interior pin of the IC, up to perhaps nine adjacent wedges for the eight signals on the eight intervening interior pins of the IC.

DESCRIPTION OF A PREFERRED EMBODIMENT

Figure 1:
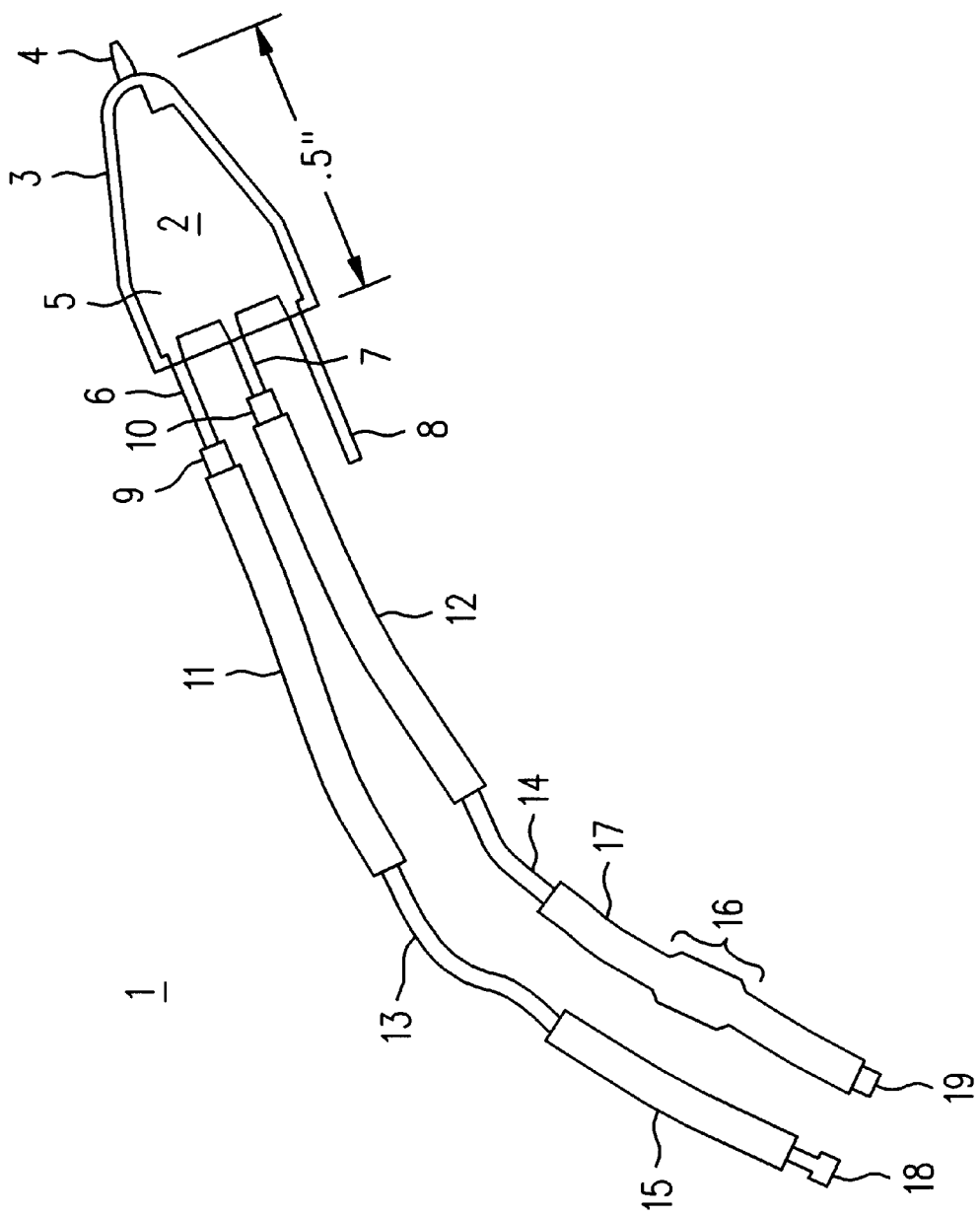
FIG. 1 is a top view of one embodiment of a portable wedge probe for perusing the signals on the pins of an IC.

Refer now to FIG. 1, wherein is shown a top view of one preferred embodiment 1 of a portable wedge probe 2 for perusing the signals on the pins or legs of an IC. In brief, the embodiment 1 includes a housing 3 that seats a row of tapered wedges 4 and a number (in this case, three) of gold plated brass pins 6, 7 and 8 to which are attached flexible insulated wires 13 and 14 that connect to the test equipment that is to perform the desired measurement. To deploy and use the probe 2, it is positioned just above a row of legs or pins of an IC (not shown) and then pressed downward to cause interdigitation of the tapered wedges with the legs of the IC. The action is similar to that shown in FIG. 1 of '324, except that the instant portable probe 2 (herein) would be present over the board 5 and IC 4 in place of the full size probe 1. To give an idea of the actual size of the probe 2 when fabricated for use on a modem quad flat pack (not shown), the overall length of the housing portion 3 is about one half an inch.

In the particular embodiment 1 shown in FIG. 1 the row of tapered wedges 4 has four wedges in the row. Since they are being viewed from the side, only the outline of the outermost wedge is visible. The four wedges in the row 4 thereof are related to the three pins 6, 7 and 8, in that four wedges enclose three adjacent legs or pins of the IC (not shown). It will be readily understood that the tapered wedges in the row 4 thereof are identical or very similar to the rows of wedges shown as reference character 2 in the FIG. 1's of both the Patents to Wardwell incorporated above, as well as in various other places in those patents: e.g., as 8 in FIG. 5 and 48–51 in FIG. 9 of the '324 Patent, and as 8, 14–20 in FIG. 4 in the '652 Patent. It may be the case that the shape of the upper portion of the tapered wedges (i.e., the part that does not wedge between the legs of the IC) may have a somewhat different shape owing to the fact that being seated in housing 3 (herein) may be different from being seated onto a mantle 52 (FIG. 9 of '324). Such differences in shape are matters of choice or convenience, and are not believed to be of any particular import. It will also be understood that the row 4 of wedges may be fabricated with a process the same as or similar to the one described in the '324 Patent.

To resume our description of FIG. 1 herein, note that no interior details are visible for the stuff that's inside the housing 3. That is because the housing 3 for probe 2 is essentially a concave container having an open side (facing up, toward the viewer) that, as a final step in fabrication for the probe 2, has been filled with a potting compound 5, such as epoxy. The three pins 6–8 preferably receive one or more flexible insulated wires that electrically connect the various IC signals being measured (through contact by the wedges 4) to the test equipment (not shown) and that also mechanically decouple the weight of the cabling or test equipment probe (neither shown) from the probe 2. This is to allow the probe 2 to remain wedged in place on an IC. In principle, if there were no pod or other probe body for the test equipment, a cable from that test equipment could connect directly to the probe 2 if that cable were sufficiently flexible and light in weight.

Flexible insulated wires 13 and 14 have push-on connectors 9 and 10 at one end that are suitable for engaging the pins 6, 7 and 8. Pins 6, 7 and 8 are internally connected within the probe 2 to the three consecutive pins or legs of the IC that the probe 2 has been wedged onto. It is up to the user to ensure that the probe 2 is correctly located on the IC for obtaining the signal on a particular pin or leg of the IC at the desired pin 6, 7 or 8 of the probe 2. Also, depending upon the measurement, there may be one, two or three flexible insulated wires respectively attached to one, two or all three of pins 6–8.

Flexible insulated wires 13 and 14 have at their other ends connectors 18 and 19 that are suitable for making electrical connection to the test equipment. Connectors 9, 10 18 and 19 are covered by layers of heat shrink tubing 11, 12, 15 and 17, respectively. In addition, flexible insulated wire 14 includes a series resistor 16 (say, in the range of twenty-five to one hundred ohms) that in the present example is between wire 14 and connector 19. Resistor 16 is optional, and may be present if the electrical situation warrants it (e.g., for isolation, to prevent loading or oscillation, or to abate spurious response, etc.). The length of flexible insulated wires 13 and 14 may be on the order of two to three inches. Note also that the selection of four tapered wedges and three pins is a matter of choice; there could be either fewer or more of both.

Figure 2:
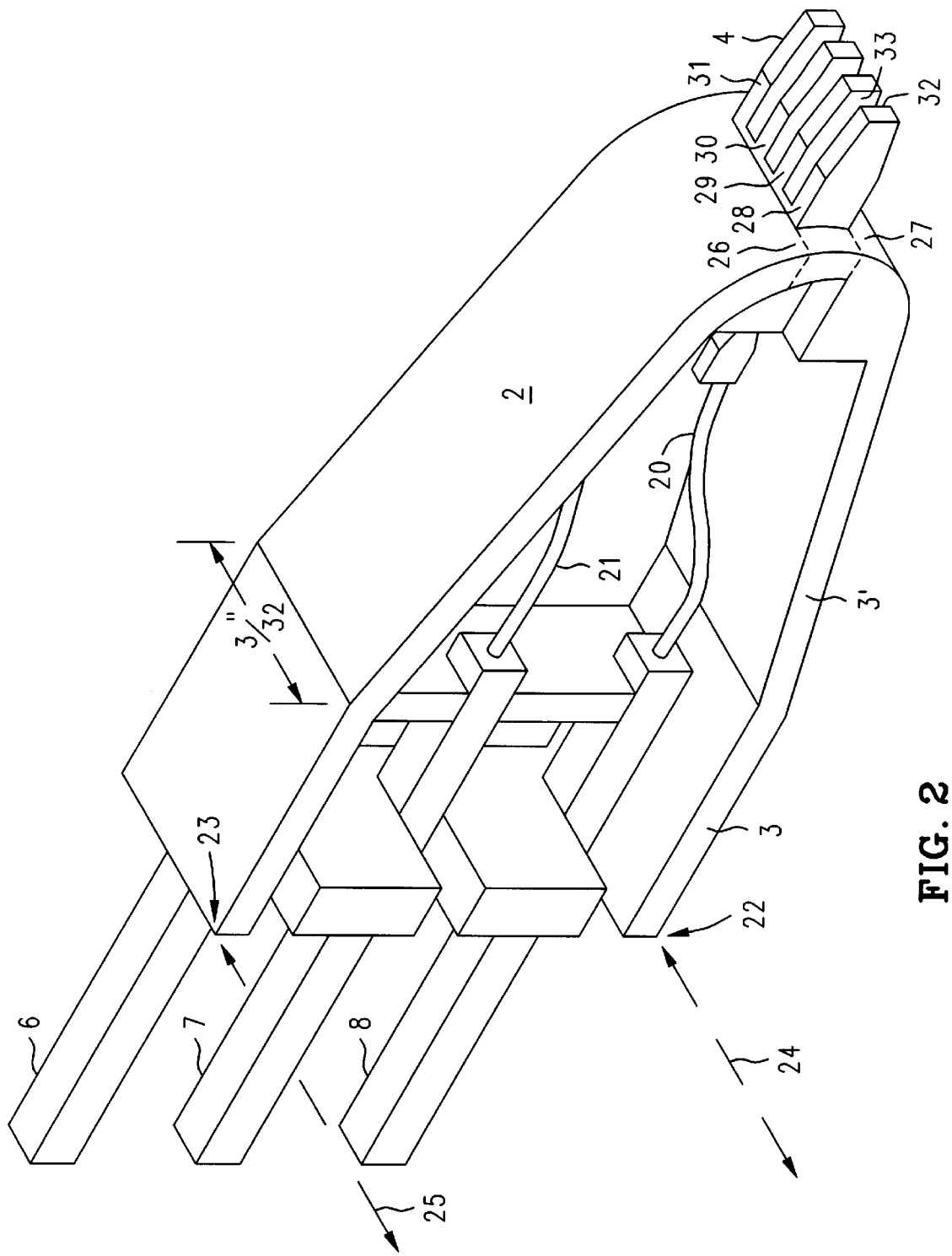
FIG. 2 is a an enlarged perspective side view of the portable wedge probe of FIG. 1.

Refer now to FIG. 2, wherein is shown an enlarged perspective side view of the portable wedge probe of FIG. 1. In this figure the probe 2 is depicted with the housing 3 on its side and without the epoxy potting. For this particular embodiment a housing of approximately 3/32" in width is desirable. In the resulting view it is clearly visible that the pins 6–8 are seated in corresponding slots and shelves, with conductors 20 and 21 electrically connecting them to the corresponding surfaces of the individual tapered wedges 28–31 that make up the row 4 thereof. For example, surface 32 of tapered wedge 28 and adjacent facing surface 33 of tapered wedge 29 are electrically connected to each other, and to pin 8 via conductor 20. Note that the conductor from pin 6 is obscured. Also note that the scale of the drawing is too small to allow a complete depiction of the structure of the individual tapered wedges 28–31. For example, we have not tried to actually show them as being tapered, but it will nevertheless be understood from FIGS. 3 & 5 of '324 and from FIG. 4 of '652 that they are. Those same figures in the incorporated Wardwell Patents win also confirm that the tapered wedges 28–31 resolve into exterior conductive surfaces separated by layers of insulation and adhesive, and that the tapered wedges are spaced apart to accommodate the leg-to-leg spacing of the legs or pins of the IC, etc. At this point it is easily appreciated that the completed probe 2 of FIG. 1 is produced if the housing 3 in FIG. 2 were filled with potting compound 5.

Now consider the case where a greater number of consecutive pins or legs of the IC is desired, say, eight pins. Then the row 4 of tapered wedges would have nine tapered wedges therein, and there would need to be eight pins corresponding to the pins 6–8. Let us discuss the metamorphosis of FIG. 2 into what such a portable probe is like. First, all other things being equal, the 3/32" width of housing 3 is insufficient; it needs to be about twice that. But instead of simply making a deeper housing, we shall assemble a pair of two half housings into a larger housing. The housing 3 shown in FIG. 2 resembles the left half housing of such a pair, except that the material in the nose between dotted lines 26 and 27 needs to be removed to accommodate the longer row of wedges, and that instead of there being three pins 6–8 there needs to be four. Bearing these modifications of the housing 3 in mind (call it 3' when so modified), now consider its mirror image (not shown). That mirror image of 3' would be a right half housing. It would have its own back corners corresponding to corners 22 and 23 on the left half housing 3'. When the two half housings are in alignment those corners would be positioned along lines 24 and 25, respectively. What is done is to attach the conductors (20, 21) to the pins (6–8), position the longer row 4 in one of the half housings, position the pins in their half housings, fill the half housings with epoxy and then bring them into aligned contact while the epoxy cures. Whether there is just one entire long row 4 of tapered wedges initially located in one half housing, or two half rows with one in each half housing, prior to aligned contact, is a matter of choice.

I claim:

1. A probe for making electrical connections to the legs of an integrated circuit, the probe comprising:

(a) a single row of n+1 tapered wedges, spaced apart by n intervening spacers, that interdigitate with n adjacent legs of an integrated circuit, each tapered wedge having first and second conductive surfaces separated by an insulating medium, the first conductive surface of an interior wedge in the row thereof being electrically connected to the second conductive surface of the tapered wedge adjacent on one side and the second conductive surface of that interior tapered wedge being electrically connected to the first conductive surface of the tapered wedge adjacent on the other side;

(b) a plurality of n pins for receiving electrical connectors;

(c) a plurality of n electrical conductors, each connecting a pin in the plurality of n pins to an electrical connection recited in (a) between a conductive surface on a tapered wedge and a conductive surface on an adjacent tapered wedge;

(d) a housing that seats the single row of n+1 tapered wedges, the plurality of n pins and encloses the plurality of n electrical conductors.

2. A probe as in claim 1 further comprising a flexible insulated conductor having a first electrical connector on one end that engages a pin in the plurality thereof and a second electrical connector at the opposite end.

3. A probe as in claim 2 further comprising a resistance electrically in series with the first and second electrical connectors.

4. A probe as in claim 1 wherein the housing comprises two halves that are glued together.

5. A probe as in claim 1 wherein the housing is a concave container open on one side and filled with a potting compound.

* * * * *